(12) United States Patent
Ukigaya

(10) Patent No.: US 7,959,971 B2
(45) Date of Patent: Jun. 14, 2011

(54) FILM FORMATION METHOD WITH DEPOSITION SOURCE POSITION CONTROL

(75) Inventor: Nobutaka Ukigaya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1113 days.

(21) Appl. No.: 11/691,559

(22) Filed: Mar. 27, 2007

(65) Prior Publication Data

US 2007/0231460 A1 Oct. 4, 2007

(30) Foreign Application Priority Data

Mar. 31, 2006 (JP) ................................. 2006-098370
Mar. 22, 2007 (JP) ................................. 2007-074086

(51) Int. Cl.
*C23C 16/00* (2006.01)
(52) U.S. Cl. ......................................... 427/248.1; 427/8
(58) Field of Classification Search ........................ None
See application file for complete search history.

(56) References Cited

U.S. PATENT DOCUMENTS

| 3,639,165 A * | 2/1972 | Rairden, III ................... 428/433 |
| 2003/0234371 A1* | 12/2003 | Ziegler ....................... 250/423 R |
| 2004/0016400 A1* | 1/2004 | Kim et al. ..................... 118/667 |

FOREIGN PATENT DOCUMENTS

| JP | 2000-265263 | 9/2000 |
| JP | 2004-035964 | 2/2004 |
| JP | 2005-120441 | 5/2005 |
| JP | 2005-336535 | 12/2005 |

OTHER PUBLICATIONS

Asada, JP 2004-35964, English machine translation, May 2004.*
Osamu, Machine trans of JP2005-120441, pub: May 2005.*

* cited by examiner

*Primary Examiner* — Timothy H Meeks
*Assistant Examiner* — Joseph Miller, Jr.
(74) *Attorney, Agent, or Firm* — Fitzpatrick, Cella, Harper & Scinto

(57) ABSTRACT

When a multiple-panel forming process for producing a plurality of panels on a large-size substrate is employed, when production thereof is continued over a long period, or in other cases, a predetermined film thickness distribution can be stably obtained according to a method of the present invention. Vapor deposition on a substrate is performed by evaporating particles from a vapor deposition source arranged opposite to the substrate in a vacuum chamber. By changing a distance between the substrate and an opening provided at the vapor deposition source by a vapor deposition source position control mechanism, change with elapse of time in the film thickness distribution of a thin film formed on the substrate is controlled.

1 Claim, 7 Drawing Sheets

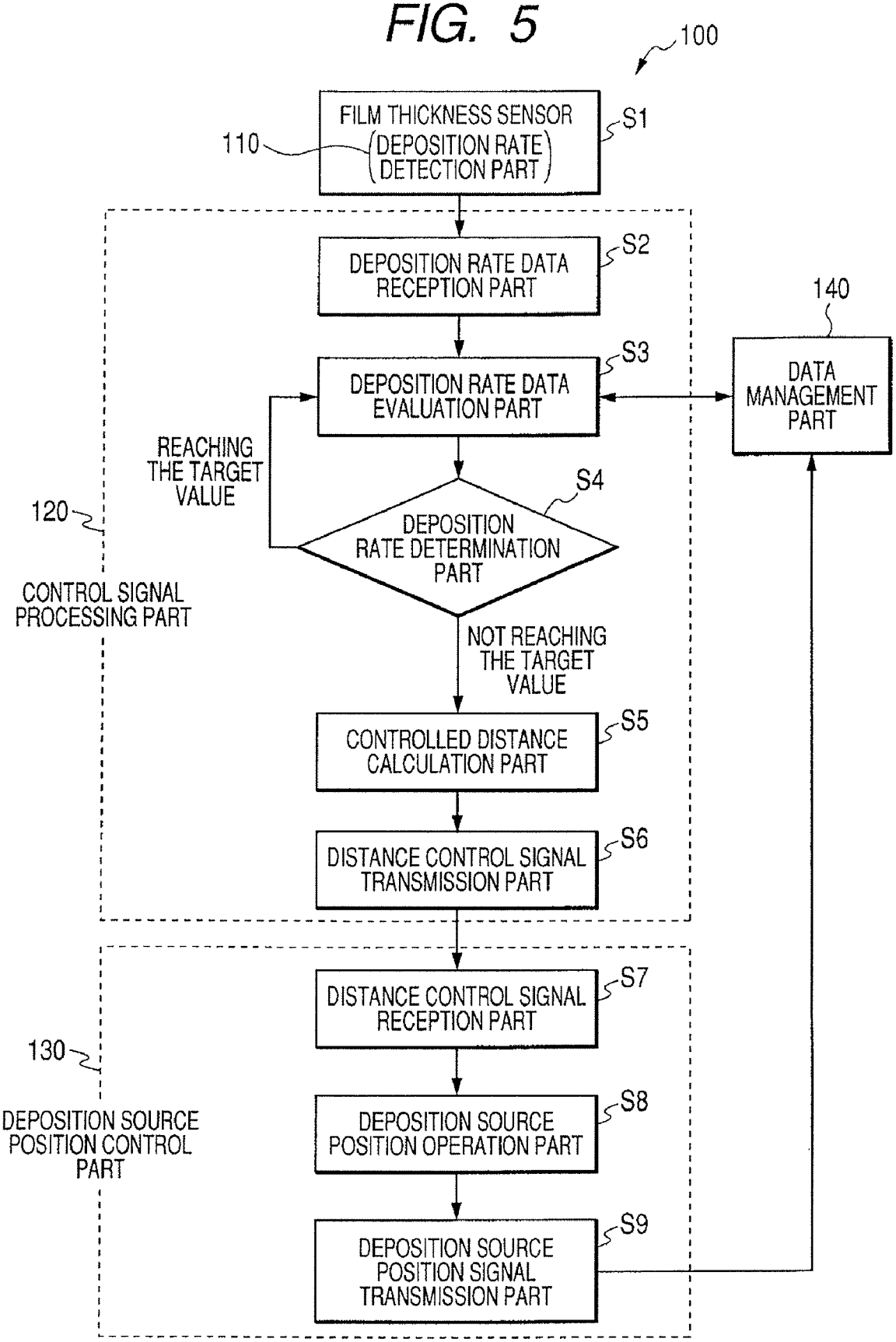

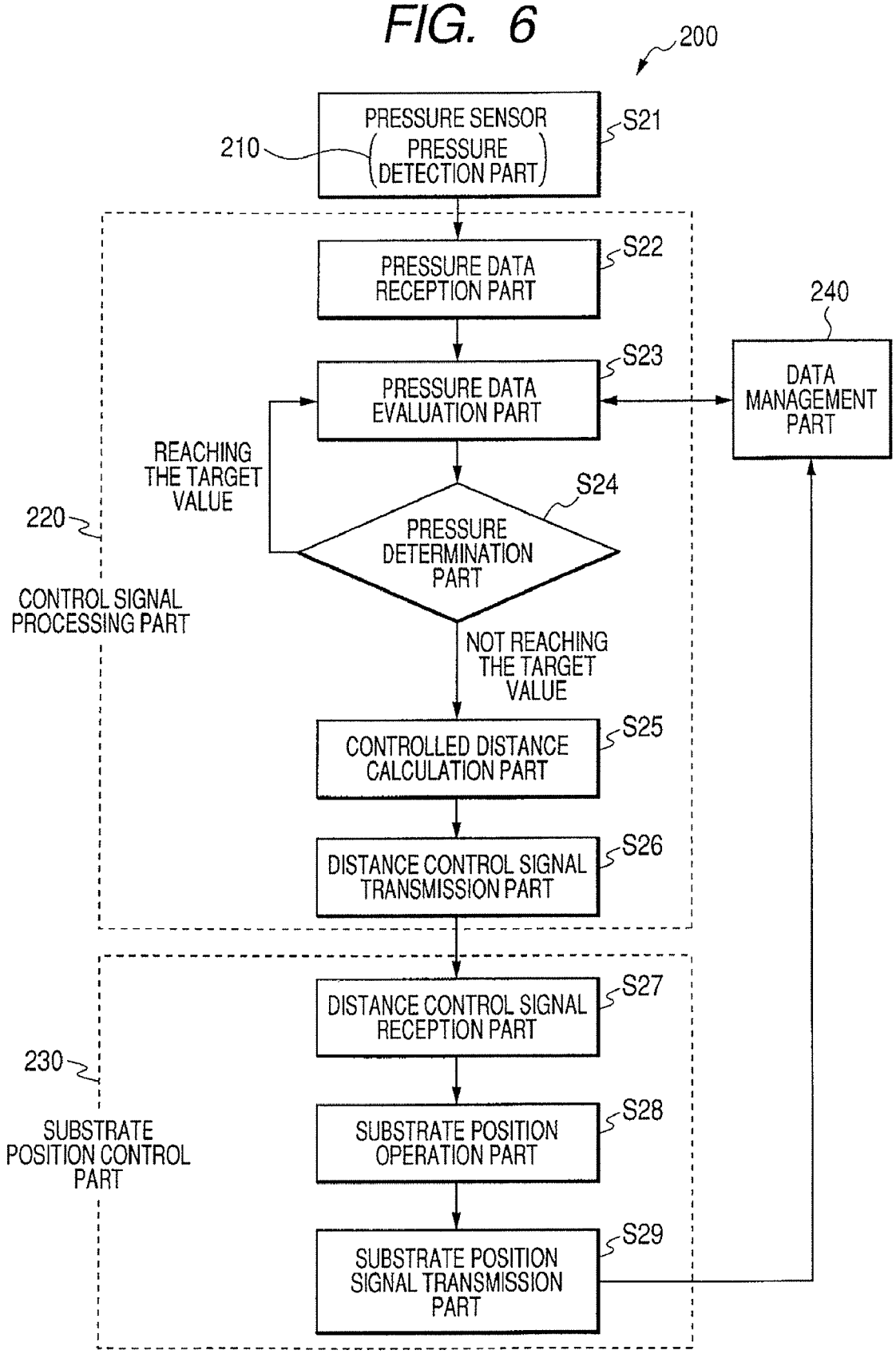

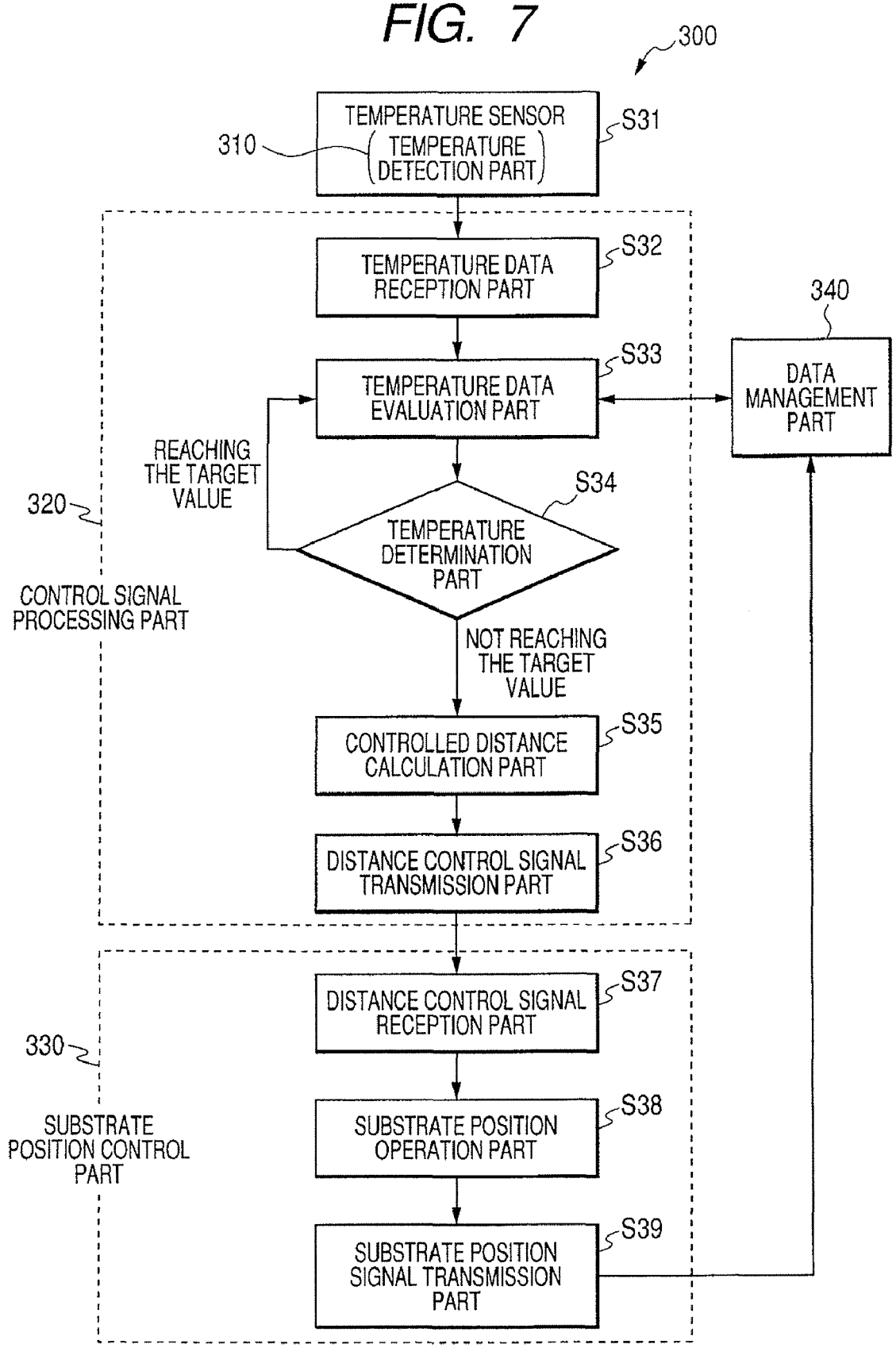

FILM FORMATION METHOD WITH DEPOSITION SOURCE POSITION CONTROL

BACKGROUND OF THE INVENTION

1. Field of the Invention

The present invention relates to a film formation method for forming an organic compound layer of an organic electroluminescent device or the like by vapor deposited.

2. Description of the Related Art

An organic electroluminescent device has attracted attention as a display device adaptable to a full-color flat panel display. The organic electroluminescent device is a self-luminous type device which emits light by electrically exciting an organic compound layer having fluorescence or phosphorescence, and is a thin-type device capable of performing multicolor emission with a high luminance and a large viewing angle at plane emission. The organic electroluminescent device exhibits a desired function by stacking a plurality of thin films each having a thickness of the order of nanometer. In flat panel display in which such organic electroluminescent devices are arrayed in a substrate surface, it is an important problem in production of the device to make the film thickness distribution of a plurality of thin organic compound layers constituting the devices uniform.

As a vapor deposition apparatus for producing such an organic electroluminescent device, a vapor deposition apparatus disclosed in Japanese Patent Application Laid-Open No. 2004-35964 will be simply described.

The vapor deposition apparatus is configured to fix a substrate on a fixing part in a vacuum chamber, and to perform vapor deposition while moving a vapor deposition source by a vapor deposition source movement mechanism to a plurality of different directions of X, Y, Z or θ, or to a synthesized direction of the plurality of the directions.

The vapor deposition apparatus in which a distance between the vapor deposition source and the substrate is shortened and the deposition source is moved along the substrate surface enables uniform in-plane thickness distribution of a formed thin film and improvement of the efficiency of a vapor deposition material by reducing the wastefully scattered amount of the vapor deposition material outside the substrate.

However, with the conventional technology disclosed in Japanese Patent Application Laid-Open No. 2004-35964, when a multiple-panel forming process in which a plurality of panels is produced on a large-size substrate is employed, when production of the device is continued over a long period of time or in other cases, a constant film thickness distribution is difficulty obtained and the yield is also reduced. Hence, a display device provided with the organic electroluminescent device has such a problem that light emission unevenness in pixels and substrate surfaces occur and luminance deterioration is accelerated due to too much electric current in regions having an insufficient thickness.

SUMMARY OF THE INVENTION

The present invention provides a film formation method by which a constant film thickness distribution can be stably obtained when a multiple-panel forming process is employed, when production of the device is continued over a long period of time or in other cases.

For solving the above-mentioned problem, the film formation method according to the present invention is a film formation method for forming a film on a substrate for film formation by discharging a vapor deposition material mounted on a vapor deposition source from the vapor deposition source arranged opposite to the substrate in a vacuum chamber, the film deposition method including: discharging the vapor deposition material from the vapor deposition source by heating the vapor deposition material; and changing a distance between an opening provided at the vapor deposition source and the substrate so that change with elapse of time in a film thickness distribution of the film formed on the substrate are controlled during the discharging of the vapor deposition material.

Since the method of the present invention is configured as described above, the present invention has the following effects.

By changing a distance between the substrate for film formation and the opening provided at the vapor deposition source, which has a correlation with the film thickness distribution, a thin film having a constant film thickness distribution can be stably produced with a high precision.

Further features of the present invention will become apparent from the following description of exemplary embodiments with reference to the attached drawings.

BRIEF DESCRIPTION OF THE DRAWINGS

FIG. 5 is a flow chart illustrating an example of a control system of a vapor deposition source position control mechanism used for performing the present invention.

FIG. 6 is a flow chart illustrating an example of a control system of a substrate position control mechanism used for performing the present invention.

FIG. 7 is a flow chart illustrating another example of a control system of a substrate position control mechanism used for performing the present invention.

DESCRIPTION OF THE EMBODIMENTS

Figure 1:
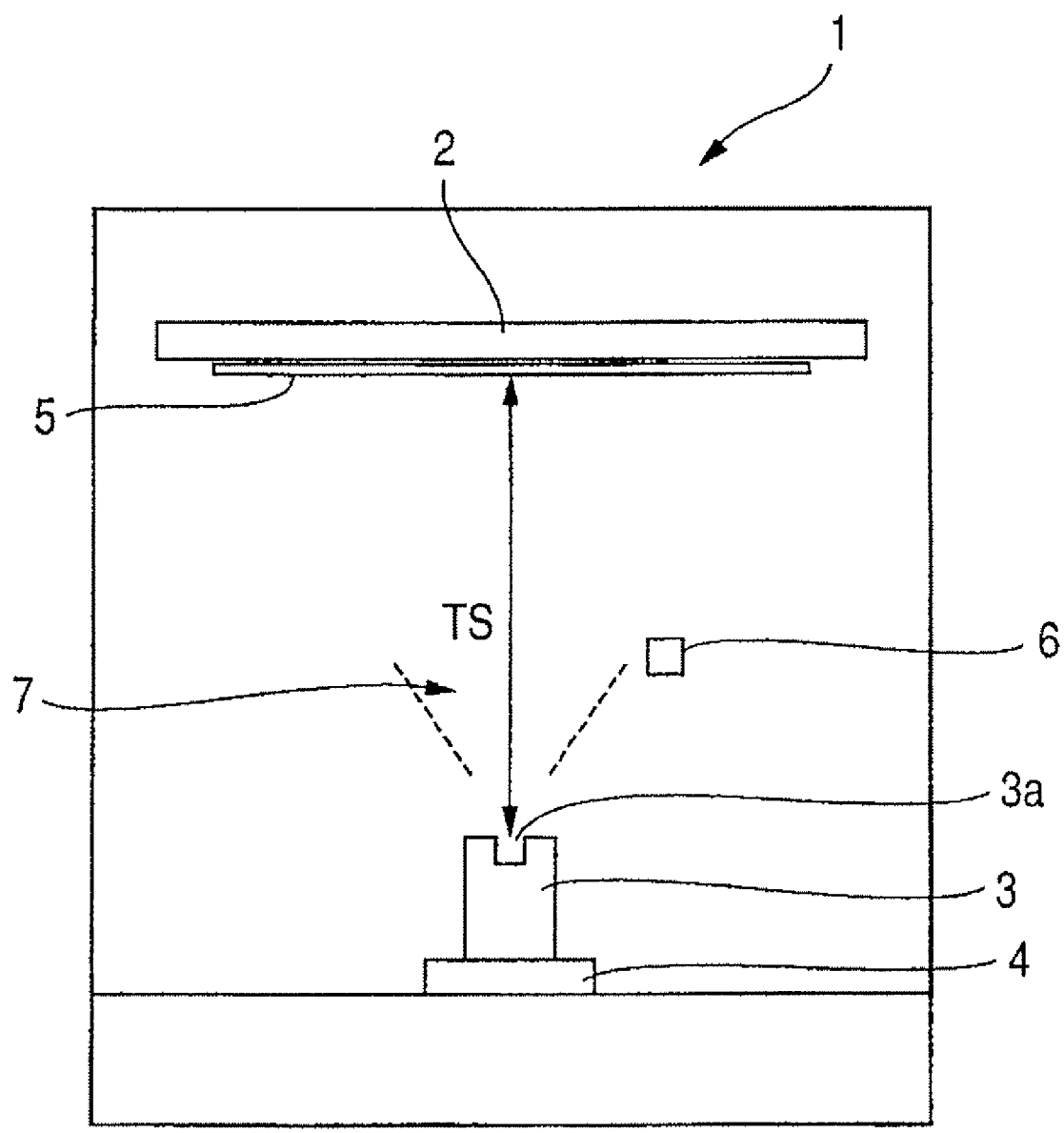
FIG. 1 is a schematic view illustrating a producing apparatus used for performing a film formation method according to one embodiment of the present invention.

Embodiments of film formation method according to the present invention will be described.

It is known that the mean free pass of particles evaporating from a vapor deposition source toward a substrate is generally proportional to the temperature inside a vacuum chamber and inversely proportional to the pressure therein. However, since in the vicinity of an opening of the vapor deposition source, evaporated particles are present at a high density and receive a large influence of radiant heat from the heated vapor deposition source, the condition in the vicinity is different from the average environment inside the vacuum chamber. Specifically, the pressure in the vicinity of the opening provided at the vapor deposition source is higher than the average pressure inside the vacuum chamber and the temperature therein is also higher than the average temperature inside the vacuum chamber. The pressure inside a vacuum chamber is commonly in the range from 1e-3 Pa to 1e-4 Pa, but the pressure in the vicinity of a vapor deposition source opening is commonly higher. Although the pressure in the vicinity of the vapor deposition source opening is different depending on the material to be used and the structure of the deposition source, the present inventors' experiments and their analysis had cases where the pressure in the vicinity of a deposition source opening was in the range from 1e-1 to 1e-2 Pa. The average temperature inside the vacuum chamber is controlled nearly in the range from 20° C. to 40° C., but the temperature in the vicinity of the vapor deposition source opening is higher. Although the temperature in the vicinity of the vapor deposition source opening is different depending on the material to be used and the structure of the vapor deposition source, since the temperature applied to heat a vapor deposition material was 200° C. or more in the inventors' experiments, the temperature in the vicinity of the vapor deposition source opening rose to several hundreds ° C. in many cases.

Meanwhile, it is known that the film thickness distribution of a thin film formed by deposition of particles evaporated from a vapor deposition source on a substrate is expressed by the equation called the cosine law. The distance TS (hereinafter, referred to as "separated distance"), as a parameter thereof, between the substrate and the vapor deposition source in the normal direction to the substrate has a condition of a distance where particles can keep up flying without repeating mutual collisions.

However, in the vicinity of an opening provided at the vapor deposition source, evaporated particles are in a high density state as described above. That is, in the vicinity of an opening of the vapor deposition source, mutual collisions of the evaporated particles are repeated and the frequency of the collisions decays as the particles separate from the opening. Hence, the particles in the vicinity of the opening of the vapor deposition source are not considered to conform to the cosine law and the particles separated a distance or more apart from the opening of the vapor deposition source are considered to conform to the cosine law.

Now, if L refers to a distance between collisions when particles evaporated from an opening of a vapor deposition source are repeating mutual collisions, a distance TS' (hereinafter, referred to as "substantial separated distance"), which substantially contributes to the film thickness distribution, between the opening of the vapor deposition source and a substrate is considered to be expressed as follows.

$$TS'=TS-L \quad \text{(equation 1)}$$

On the other hand, the film thickness distribution changing in the course of continuing the vapor deposition for a long time was experimentally confirmed to be able to be stabilized by control of the separated distance TS. From this fact, if the film thickness distribution in a substrate surface conforms to the cosine law, the controlling of the separated distance TS in such a manner is considered to have adjusted the distance according to variation amounts ΔL of the L in the above-mentioned experiments.

In the experiments, it was together confirmed that change with elapse of time in pressure and temperature inside a vacuum chamber had a correlation with change with elapse of time in film thickness distribution. This implies that, according to the above-mentioned definition of mean free path, the mean free path of evaporated particles changes due to change in pressure and temperature inside the vacuum chamber, and thereby the mutual collision frequency of the evaporated particles changes in the vicinity of the opening of the vapor deposition source. That is, the L is construed to be changed by change in pressure and temperature inside the vacuum chamber.

From above, by changing the separated distance TS corresponding to a film thickness distribution, or change with elapse of time in pressure and temperature inside a vacuum chamber, the change with elapse of time in film thickness distribution can be said to be controlled.

As described above, by control of changing the separated distance TS corresponding to change with elapse of time in pressure inside a vacuum chamber, a thin film vapor-deposited on a surface on which a film is formed of a substrate can be made to have a target film thickness distribution. For example, when the pressure inside the vacuum chamber decreases with elapse of time, the pressure difference between the pressure in the very vicinity of opening of the vapor deposition source and that inside the vacuum chamber increases with elapse of time. Hence, since the distance L shortens, the separated distance TS is shortened. By contrast, when the pressure inside the vacuum chamber increases with elapse of time, since the pressure difference between the pressure in the very vicinity of the opening of the vapor deposition source and that inside the vacuum chamber decreases with elapse of time, the separated distance TS is elongated.

For example, when the separated distance TS is set to 200 mm, and a point source is used as a vapor deposition source, for vapor deposition in restriction of the in-plane film thickness distribution within ±10% inclusive in the area of 200 mmφ, the variation amount ΔL can be controlled between 5 mm to 50 mm for the pressure change in the range from 1e-5 Pa to 1e-3 Pa.

Further, by control of changing the separated distance TS corresponding to change with elapse of time in temperature inside the vacuum chamber, a thin film vapor-deposited on a surface on which a film is formed of a substrate can be made to have a target film thickness distribution. For example, when the temperature decreases with elapse of time, the temperature difference between the temperature in the very vicinity of the opening of the vapor deposition source and that inside the vacuum chamber increases with elapse of time. Hence, since the distance L is elongated, the separated distance TS is elongated. By contrast, when the temperature inside the vacuum chamber rises with elapse of time, since the temperature difference between the temperature in the very vicinity of the opening of the vapor deposition source and that inside the vacuum chamber decreases with elapse of time, the separated distance TS is shortened.

For example, when the separated distance TS is set to 200 mm, and a point source is used as a vapor deposition source, for vapor deposition in restriction of the in-plane film thickness distribution within ±10% inclusive in the area of 200 mmφ, the variation amount ΔL can be controlled between 1 mm to 20 mm for the temperature change in the range from 20° C. to 40° C.

Since change in pressure or temperature inside a vacuum chamber involves change in the distance L, the vapor deposition rate distribution of a material evaporated in the vacuum chamber changes along with the change in pressure or temperature inside the vacuum chamber. Hence, by control of changing the separated distance TS corresponding to change with elapse of time in the vapor deposition rate distribution of the material evaporated in the vacuum chamber, a thin film vapor-deposited on the surface on which a film is formed of a substrate can be made to have a target film thickness distribution. Specifically, when the directivity of the vapor deposition rate distribution intensifies with vapor deposition time, the separated distance TS between the substrate and an opening provided at a vapor deposition source can be elongated. By contrast, when the directivity of the vapor deposition rate distribution weakens with elapse of time, the separated distance TS is shortened. The directivity of the vapor deposition rate distribution herein described means that the weaker directivity discharges an evaporated material into evaporation space in a more isotropic rate distribution.

The above-mentioned control is possible even with one film thickness sensor, but it can have two or more sensors. Because detection of evaporation rates at plural positions can capture the aspect of changes in film thickness distribution more precisely. In the case of one film thickness sensor, since the evaporation rate cannot be detected at a plurality of positions, the evaporation rate distribution cannot be determined by the detected evaporation rate alone. Hence, for determining the evaporation rate distribution, a correlation between the evaporation rate and the evaporation rate distribution has to be previously examined.

The range of $\Delta L$ is shown in the above description, but the present invention is not limited thereto, practically, as long as it can be appropriately set corresponding to the separated distance TS, the structure of a vapor deposition source and its vapor deposition property.

For a vapor deposition source, generally known vapor deposition sources can be suitably used. For example, vapor deposition sources provided with a point opening, planar opening, linear opening or an opening in combination of them can be used. Especially, vapor deposition sources in which a large amount of a vapor deposition material can be charged, such as a Knudsen cell and a valve cell, allow an apparatus to be operated for a long period. In such a case, if the separated distance TS is controlled, the film formation can be stably formed for a long period with a suitably controlled film thickness distribution in the target range.

The Knudsen cell described above is a vapor deposition source of a type in which a material is filled in a heated furnace, and vapor deposition is performed by making the evaporated material fly out from a hole provided on the surface of the furnace.

The valve cell described above denotes an apparatus constitution which has a material chamber for heating and vaporizing a material, a flow path for making the vaporized material flow and an evaporation chamber for evaporating the material toward a substrate, and which is provided midway the flow path with a valve whereby the flow amount is suitably adjustable. In other words, the present invention involves processes of discharging a vapor deposition material vaporized in the material chamber to the flow path, then discharging the vapor deposition material from the flow path to the evaporation chamber, and further discharging the vapor deposition material from the evaporation chamber to a substrate for film formation. In an actual valve cell, since the structure is large, there is a case where mechanisms to detect the vapor deposition rate at the each discharging process are provided. Therefore, the present invention involves detecting a vapor deposition rate by one of the mechanisms provided in the valve cell and performing a control to obtain the target film thickness distribution based on the detected data. The material chamber is arranged outside a vacuum chamber and the size of the material chamber is not restricted by the size of the vacuum chamber. Further, the material is easily replaceable.

Further, in a vapor deposition system using a valve cell, since the internal pressure of a vapor deposition source can be stabilized, the variation amount of $\Delta L$ can be easily suppressed to a small one. Hence, even when the apparatus is operated for a long period, since $\Delta L$ can be controlled with high precision, the film formation can be stably performed for a long period with a suitably controlled film thickness distribution in the target range.

On the other hand, in the case of a boat cell, since it is smaller than a Knudsen cell and a valve cell, and is a relatively light-weight vapor deposition source, it can be easily operated, whereby the film formation having a suitably controlled film thickness distribution in the target range can be performed.

The boat cell described above is a vapor deposition source of a type which is a dish-shaped electrically conductive plate having the recess and in which a material is filled in the recess and then the conductive plate itself is electrically heated.

According to the present invention, by controlling the separated distance TS, which has a correlation with the film thickness distribution, between the surface on which a film is formed of a substrate and an opening provided at a vapor deposition source, change with elapse of time in film thickness distribution can be controlled.

In organic electroluminescent devices produced using the film formation method according to the present invention, light emission unevenness in pixels or substrate surfaces is suppressed, and luminance deterioration with elapse of time is reduced.

FIG. 1 is an illustrative view showing a basic structure of a producing apparatus used in performing a film formation method according to an embodiment of the present invention.

A substrate holding mechanism 2 for holding a substrate 5 on which a film is formed is arranged in the upper section in a vacuum chamber 1. A vapor deposition source position control mechanism 4 for changing the position of a vapor deposition source 3 in the normal direction to the surface 5a on which a film is formed of the substrate 5 is arranged in the lower section of the vacuum chamber 1.

A film thickness sensor 6 for detecting the vapor deposition rate of a vapor deposition material is arranged in the vicinity of the vapor deposition source 3. The vapor deposition source position control mechanism 4 moves the vapor deposition source 3 in the normal direction to the surface 5a of the substrate 5 corresponding to the vapor deposition rate detected by the film thickness sensor 6 to change the separated distance TS between the substrate 5 and an opening 3a provided at the vapor deposition source 3, thereby controlling change with elapse of time in film thickness distribution.

Then, a control system of the vapor deposition source position control mechanism 4 will be described referring to FIG. 5.

The control system 100 shown here is roughly divided into and includes a vapor deposition rate detection part 110, a control signal processing part 120, a vapor deposition source position control part 130 and a data management part 140.

The vapor deposition rate detection part 110 is provided with a film thickness sensor S1 to detect the vapor deposition rate. The control signal processing part 120 originates control signals necessary in the cases where the vapor deposition rate is or is not in the range of target values. The data management part 140 stores data necessary for control of the vapor deposition source position control part 130 to change the position of the vapor deposition source.

First, the vapor deposition rate detected by the film thickness sensor S1 of the vapor deposition rate detection part 110 is transmitted to a vapor deposition rate data reception part S2 included in the control signal processing part 120. The received detected vapor deposition rate data is compared with a set vapor deposition rate necessary to obtain a constant film thickness distribution by a vapor deposition rate data evaluation part S3, and the difference is transmitted to a vapor deposition rate determination part S4. Herein, the comparison and the operation conducted in the vapor deposition rate data evaluation part S3 refers to data stored in the data management part 140.

Then, the vapor deposition rate determination part S4 determines whether or not the data transmitted from the vapor deposition rate data evaluation part S3 reaches the target value. When the data does not reach the target, a part or the whole of the information (for example, the difference) received by the vapor deposition rate data evaluation part S3 is transmitted to a controlled distance calculation part S5 to adjust the vapor deposition surface position. The controlled distance calculation part S5 calculates a distance necessary to obtain the target value of the film thickness distribution, and transmits the calculated distance to a distance control signal transmission part S6.

Then, the signal is transmitted to a distance control signal reception part S7 provided in the vapor deposition source position control part 130. Thereby, a vapor deposition source is moved by a vapor deposition source position operation part S8 to change the separated distance TS between an opening provided at the vapor deposition source and a substrate so that a constant film thickness distribution can be obtained.

Then, after the vapor deposition source is moved, the changed vapor deposition source position is transmitted to the data management part 140 by a vapor deposition source position signal transmission part S9.

The film thickness sensor S1 monitors the vapor deposition rate at a place different from the substrate, which means that the sensor indirectly detects the vapor deposition rate of a vapor deposition material depositing on the substrate. However, the sensor is not limited to this, but a film thickness monitor to directly measure changes over time in film thickness distribution in the substrate surface may be used.

The film thickness sensor includes thickness sensors using a quartz oscillator or of optical type. A unit for directly measuring the film thickness distribution of a substrate surface includes an optical film thickness sensor to measure by making light enter from the outside of a vacuum chamber through a port provided on the vacuum chamber.

The present invention does not limit whether change with elapse of time in film thickness distribution in a substrate surface are directly or indirectly measured, and also does not limit units for the measurement. Film thickness sensors commonly used in vacuum deposition apparatuses are applicable.

Further, the structure, arrangement and number of vapor deposition sources are not limited. For example, in the case of vapor codeposition where a plurality of different materials is provided on respective vapor deposition sources and deposited simultaneously, a vapor deposition source position control mechanism and a film thickness sensor are provided for each vapor deposition source, and the separated distance TS between a substrate and the each vapor deposition source may be independently controlled according to a signal from the each film thickness sensor.

Figure 2:
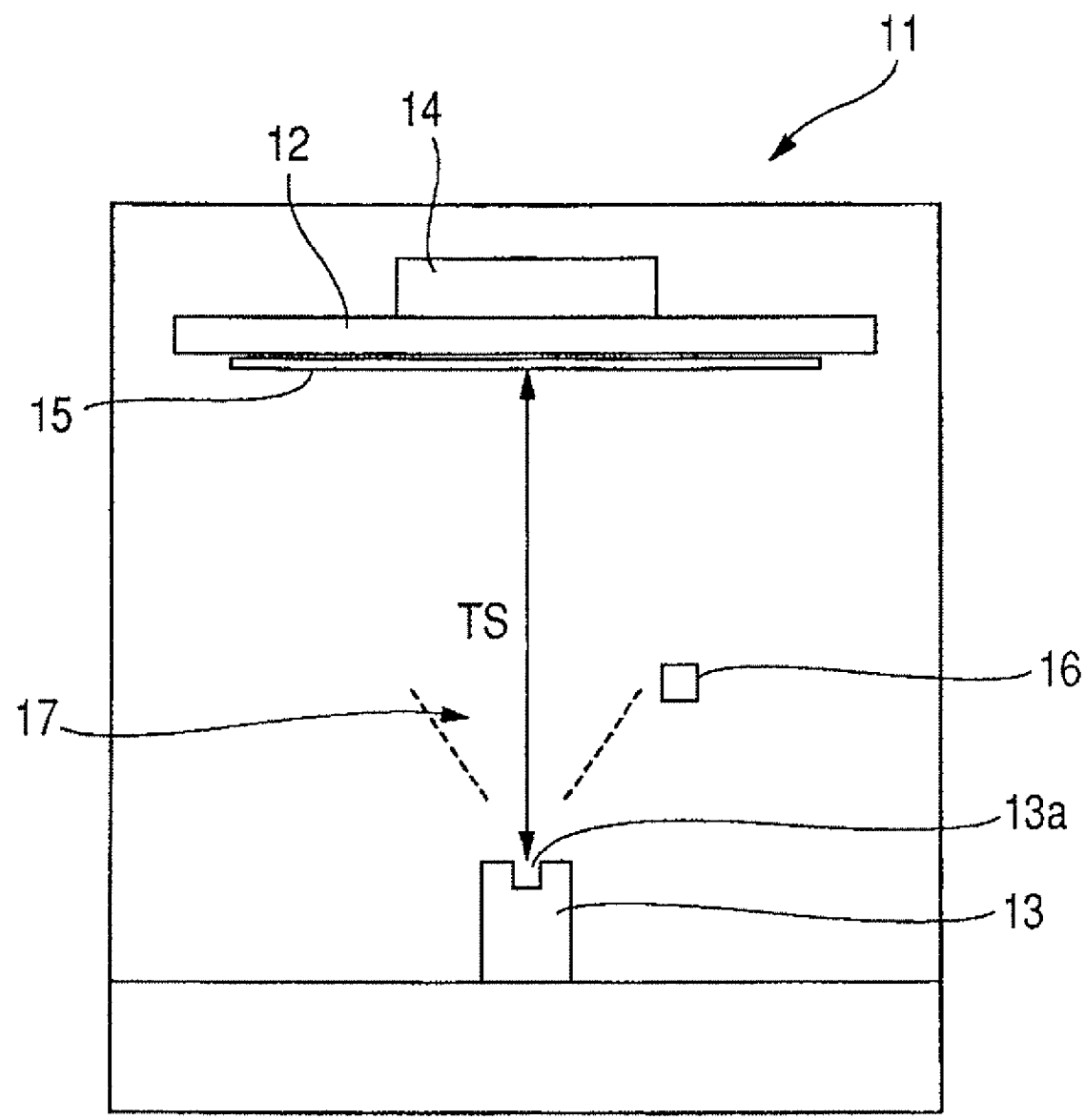
FIG. 2 is a schematic view illustrating a producing apparatus used for performing a film formation method according to another embodiment of the present invention.

Next, another embodiment will be described. In the another embodiment, as illustrated in FIG. 2, a substrate position control mechanism 14 provided with a substrate holding mechanism 12 to hold a substrate 15 is provided as a unit for changing the separated distance TS between the substrate 15 and an opening 13a provided at a vapor deposition source 13. Further, a pressure sensor (not shown) is provided in a vacuum chamber. The structures other than these are similar to ones illustrated in FIG. 1.

Then, a control system 200 of the substrate position control mechanism will be described referring to FIG. 6.

The different points from the control system of FIG. 5 are that an object to detect is the pressure inside the vacuum chamber and that the substrate position control mechanism 14 for changing the separated distance TS between the substrate and the opening provided on the vapor deposition source is arranged on the substrate side.

First, the pressure inside the vacuum chamber detected by a pressure sensor S21 of a pressure detection part 210 is transmitted to a pressure data reception part S22 included in a control signal processing part 220. The received pressure data detected by the pressure sensor S21 is compared with the pressure (target pressure) necessary to obtain a constant film thickness distribution by a pressure data calculation part S23, and the difference is transmitted to a pressure determination part S24. The comparison and the operation conducted by the pressure data evaluation part S23 refer to data stored in a data management part 240.

Then, the pressure determination part S24 determines whether or not the data transmitted from the pressure data evaluation part S23 reaches the target value. When the data does not reach the target, a part or the whole of the information (for example, the difference) received by the pressure data evaluation part S23 is transmitted to a controlled distance calculation part S25 to adjust the substrate position.

The controlled distance calculation part S25 calculates a distance necessary to obtain the target value of the film thickness distribution, and transmits the calculated distance to a distance control signal transmission part S26.

Then, the signal is transmitted to a distance control signal reception part S27 provided in the substrate position control part 230. Thereby, the substrate 15 is moved by a substrate position operation part S28 to change the separated distance TS between the substrate 15 and the opening 13a provided at the vapor deposition source 13 so that a desired film thickness distribution can be obtained.

Then, after the substrate 15 is moved, the changed substrate position is transmitted to the data management part 240 by a substrate position signal transmission part S29.

The mechanisms for changing the separated distance TS between the substrate and the opening provided at the vapor deposition source are different between in FIG. 1 and FIG. 2, but an optimum mechanism can be selected depending on the structure of a film formation apparatus. Further, a vapor deposition source position control mechanism and a substrate position control mechanism both may be combined so that both positions of a substrate and an opening provided at a vapor deposition source can optionally be changed.

Not by moving the whole of a vapor deposition source as in FIG. 1, but by moving only an opening, which is a part of the vapor deposition source, the separated distance TS between the substrate and the opening provided at the vapor deposition source may be changed. For example, in the cases where the vapor deposition source is hardly moved due to the large size of the vapor deposition source and where the circumferential structure of the vapor deposition source restricts the moving range of the whole vapor deposition source, the apparatus structure can be one in which only the opening provided at the vapor deposition source can be moved. Since a movable part is an opening provided on the deposition source, the mechanism is relatively simplified, bringing about advantages of easy maintenance, easy replacement work of components, etc.

As units for indirectly capturing (detecting) change with elapse of time in film thickness distribution, a pressure sensor for detecting the pressure inside a vacuum chamber and a temperature sensor for detecting the temperature therein may be used. These sensors can be arranged by selecting places where changes over time in film thickness distribution can be sensitively captured. For example, a place which does not obstruct deposition to a substrate in a space between the substrate and the deposition source corresponds to that place.

In the present invention, as a unit for indirectly capturing (detecting) change with elapse of time in film thickness distribution, a temperature sensor for detecting the temperature inside a vacuum chamber can be used. A control system in the case of using a temperature sensor is illustrated in FIG. 7. The control system 300 illustrated in FIG. 7 just replaces the pressure sensor S21 of the control system 200 illustrated in FIG. 6 by a temperature sensor S31.

The temperature inside the vacuum chamber detected by the temperature sensor S31 of a temperature detection part 310 is transmitted to a temperature data reception part S32 included in a control signal processing part 320. The received temperature data detected by the temperature sensor S31 is compared with the temperature (target temperature) necessary to obtain a constant film thickness distribution by a temperature data evaluation part S33, and the difference is transmitted to a temperature determination part S34. The comparison and the operation conducted by the temperature data evaluation part S33 refer to data stored in a data management part 340.

Then, the temperature determination part S34 determines whether or not the data transmitted from the temperature data evaluation part S33 reaches the target value. When the data does not reach the target, a part or the whole of the information (for example, the difference) received by the temperature data evaluation part S33 is transmitted to a controlled distance calculation part S35 to adjust the substrate position.

The controlled distance calculation part S35 calculates a distance necessary to obtain the target value of the film thickness distribution, and transmits the calculated distance to a distance control signal transmission part S36.

Then, the signal is transmitted to a distance control signal reception part S37 provided in the substrate position control part 330. Thereby, the substrate is moved by a substrate position operation part S38 to change the separated distance TS between the substrate and the opening of the vapor deposition source so that a desired film thickness distribution can be obtained.

Then, after the substrate is moved, the changed substrate position is transmitted to the data management part 340 by a substrate position signal transmission part S39.

The period of controlling the separated distance TS between a substrate and an opening provided at a vapor deposition source corresponding to change with elapse of time in the detected film thickness distribution may be selected, depending on applications and objects, from either a period of performed vapor deposition on the substrate or the other period, a downperiod of not performing vapor deposition.

For example, in the case of a film formation for a short vapor deposition time, the separated distance TS between a substrate and an opening provided at a vapor deposition source can be controlled utilizing the period of not performing vapor deposition. By contrast, in the case of a film formation for a long vapor deposition time, the separated distance TS between a substrate and an opening provided at a vapor deposition source can be controlled also in the period of performing vapor deposition. Since especially a substrate with a larger size results in a longer vapor deposition time, change with elapse of time in film thickness distribution can be controlled in the period of performing vapor deposition.

Additionally, the separated distance TS between a substrate and an opening provided at a vapor deposition source may be controlled corresponding to change with elapse of time in film thickness distribution in both the periods.

In a valve cell, there is a case where a film thickness sensor is provided also in a flow path. In such a case, the separated distance TS may be controlled using the vapor deposition rate detected by the film thickness sensor provided in the flow path. Especially in the downperiod, the discharging from the vapor deposition source to the vacuum chamber is sometimes temporarily suspended or controlled for the purpose of preventing adhesion of the evaporated material on the inner wall of the vacuum chamber. In such a case, the separated distance TS may appropriately be adjusted by detecting the change in the vapor deposition rate of the flow path.

A vapor deposition source of the Knudsen cell is illustrated in FIG. 1 and FIG. 2, but the present invention is not limited thereto and can use an optimum vapor deposition source depending on applications. For example, a vapor deposition source of a valve cell or a boat can be used. Any vapor deposition sources can stably control change with elapse of time in film thickness distribution by applying the present invention.

A vapor deposition source of point source type is illustrated in FIG. 1 and FIG. 2, but the present invention is not limited thereto and can use a vapor deposition source on an optimum type depending on applications. For example, a vapor deposition source of linear source type or a planar vapor deposition source which performs simultaneously film formation on a certain area can suitably be used. Any types can stably control change with elapse of time in film thickness distribution by applying the present invention.

A substrate is arranged horizontally and statically in FIG. 1 and FIG. 2, but the present invention is not limited thereto, and can use an optimum system according to applications. For example, a method of controlling the film thickness distribution by rotating the substrate may be employed, or the substrate may be nearly vertically stood. Especially with the substrate size exceeding 500 mm-square, for suppressing deflection of the substrate, the substrate can be stood, and thereby change with elapse of time in film thickness distribution can be controlled more stably.

Embodiment 1

In the present embodiment, a case where one of organic compound layers constituting an organic electroluminescent device is formed as a film will be described.

Figure 3:
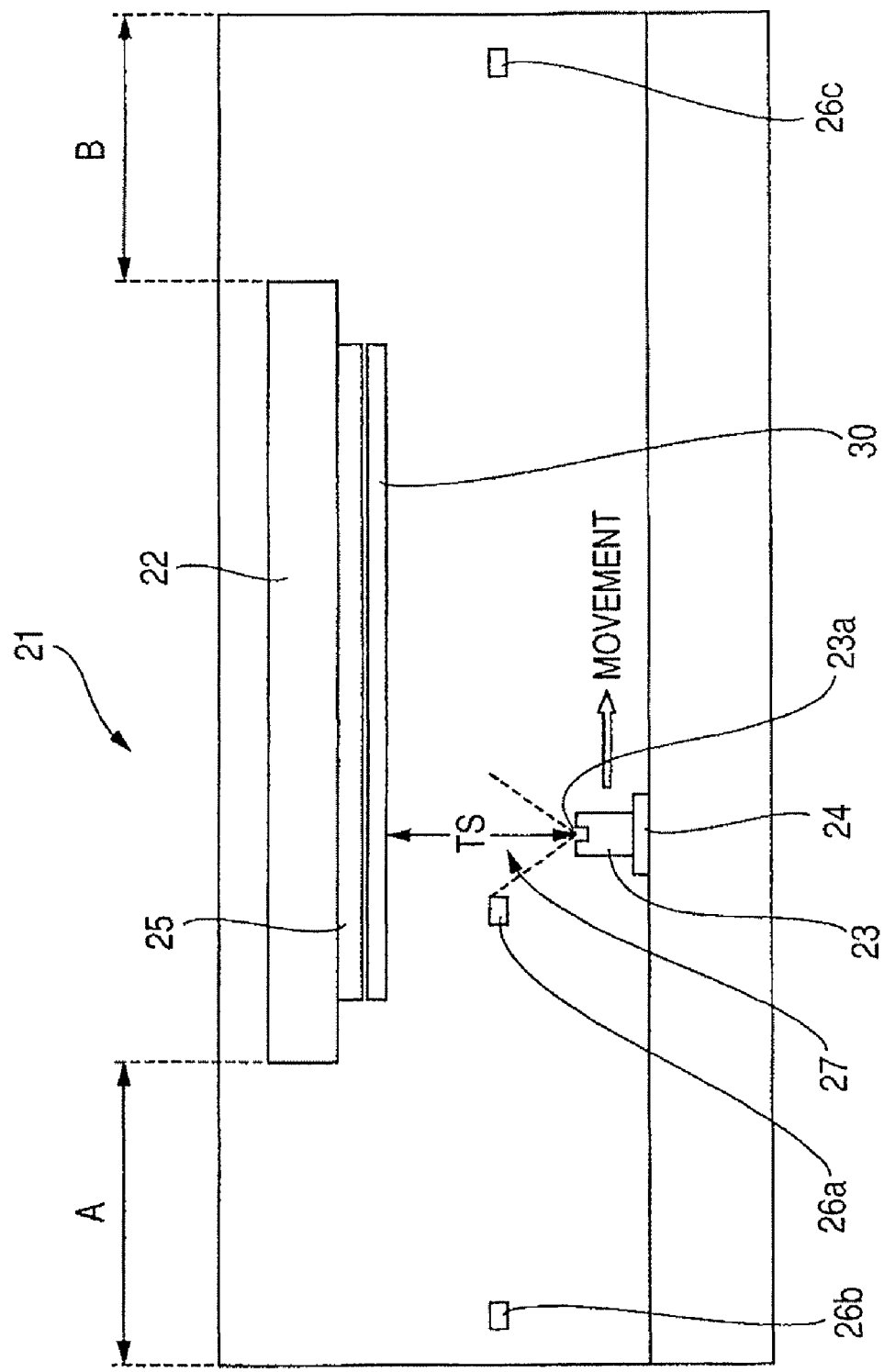
FIG. 3 is a schematic view illustrating a producing apparatus used for performing a film formation method according to still another embodiment of the present invention.

As illustrated in FIG. 3, a substrate holding mechanism 22 for holding a substrate 25 is provided in the upper section of a vacuum chamber 21, and a mask 30 is disposed on the side of a surface which a film is formed of the substrate 25.

A vapor deposition source position control mechanism 24 for moving a vapor deposition source 23 in the normal direction to the substrate surface is provided in the lower section of the vacuum chamber 21.

The vapor deposition source is a point source, and the evaporation rate distribution of an evaporation material discharged into an evaporation space conforms to the cosine law.

The vapor deposition source 23 and the vapor deposition source position control mechanism 24 can be smoothly moved along the longitudinal direction of the substrate 25 in the plane parallel with the substrate surface, and can repeatedly reciprocatively move by turning back at regions A and B illustrated in FIG. 3.

A film thickness sensor 26a is provided in the vicinity of the vapor deposition source 23, and film thickness sensors 26b and 26c are additionally arranged in the right and left regions A and B, respectively. Change with elapse of time in deposition rate are suitably detected by using the film thickness sensor 26a for always detecting the evaporation rate together with the film thickness sensors 26b and 26c for periodically detecting the evaporation rate.

Hereinafter, a case where the organic compound layer is formed as a film using this apparatus will be described.

First, in the prestage to start vapor deposition on the substrate 25, the vapor deposition rate control is performed such that the vapor deposition rate from the vapor deposition source 23 is stabilized in a predetermined range, and then deposition on the substrate 25 is started. In the deposition period and certain periods before and after the vapor deposition period, the film thickness sensor 26a in the vicinity of the vapor deposition source detects vapor deposition rates at intervals of one second.

If there arises a case where a variation of a predetermined vapor deposition rate range or more is confirmed in the vapor deposition period by the film thickness sensor 26a, the separated distance TS between the substrate 25 and the opening provided at the vapor deposition source is adjusted referring to the time change rate of the vapor deposition rate such that the film thickness distribution after the completion of the vapor deposition can fall on the target value at the time of the confirmation. The target value of the distance to be adjusted is appropriately selected from the previously obtained relation between the time change rate of the vapor deposition rate and the time change rate of the film thickness distribution. Hence, the film thickness distribution can be corrected in the course of film formation formed in a time zone when a variation has occurred.

Hereinafter, the embodiment will be further specifically described by way of an example of a case where the separated distance TS is set to 200 mm; the film thickness on completion of vapor deposition is set to 100 nm; and the target value of the film thickness distribution is set to be ±10% in a vapor deposition region of 200 mmφ. Further, the vapor deposition rate is set to 1 nm/sec, and its allowable variation range is set to ±5%. That the allowable variation value is set to be smaller than the target value of the film thickness distribution is for correction. For example, in the case where, at the time when a film of about 50 nm has been deposited after the elapse of 50 seconds from the start of the film formation, the vapor deposition rate becomes 0.93 nm/second, exceeding the allowable range, the separated distance TS is set to 210 nm. Because the decrease in the vapor deposition rate generated by the point source is due to a variation of directivity of the vapor deposition rate distribution to a slightly higher one. Therefore, increasing the separated distance TS by 10 mm can moderate the film thickness distribution of a material deposited on the substrate surface even if the directivity is raised like that.

The vapor deposition source 23 moves in the normal direction to the substrate surface to adjust the separated distance TS between the substrate 25 and the opening 23a provided at the vapor deposition source 23, but the film thickness sensor 26a does not move synchronously with this.

When the vapor deposition source 23 moves to the region A or B, the time change rate of the vapor deposition rate is detected in a state of decreasing a measuring error by confirming the time change rate of the vapor deposition rate also with the film thickness sensor 26b or 26c. If there arises a case where a variation of a predetermined vapor deposition rate range or more is confirmed, the separated distance TS between the substrate and the opening provided at the vapor deposition source is adjusted referring to the vapor deposition rate to return the film thickness distribution to the target value also at that confirmation time as described above.

Use of the film formation method according to the embodiment allows controlling the change with elapse of time in film thickness distribution within a predetermined range even in film formation over a long time. Therefore, any organic electroluminescent device produced by such a method can suppress light emission unevenness on pixels and in substrate surfaces, and reduce the luminance deterioration with elapse of time.

Embodiment 2

In Embodiment 2, a case where one of organic compound layers constituting an organic electroluminescent device will be described.

Figure 4:
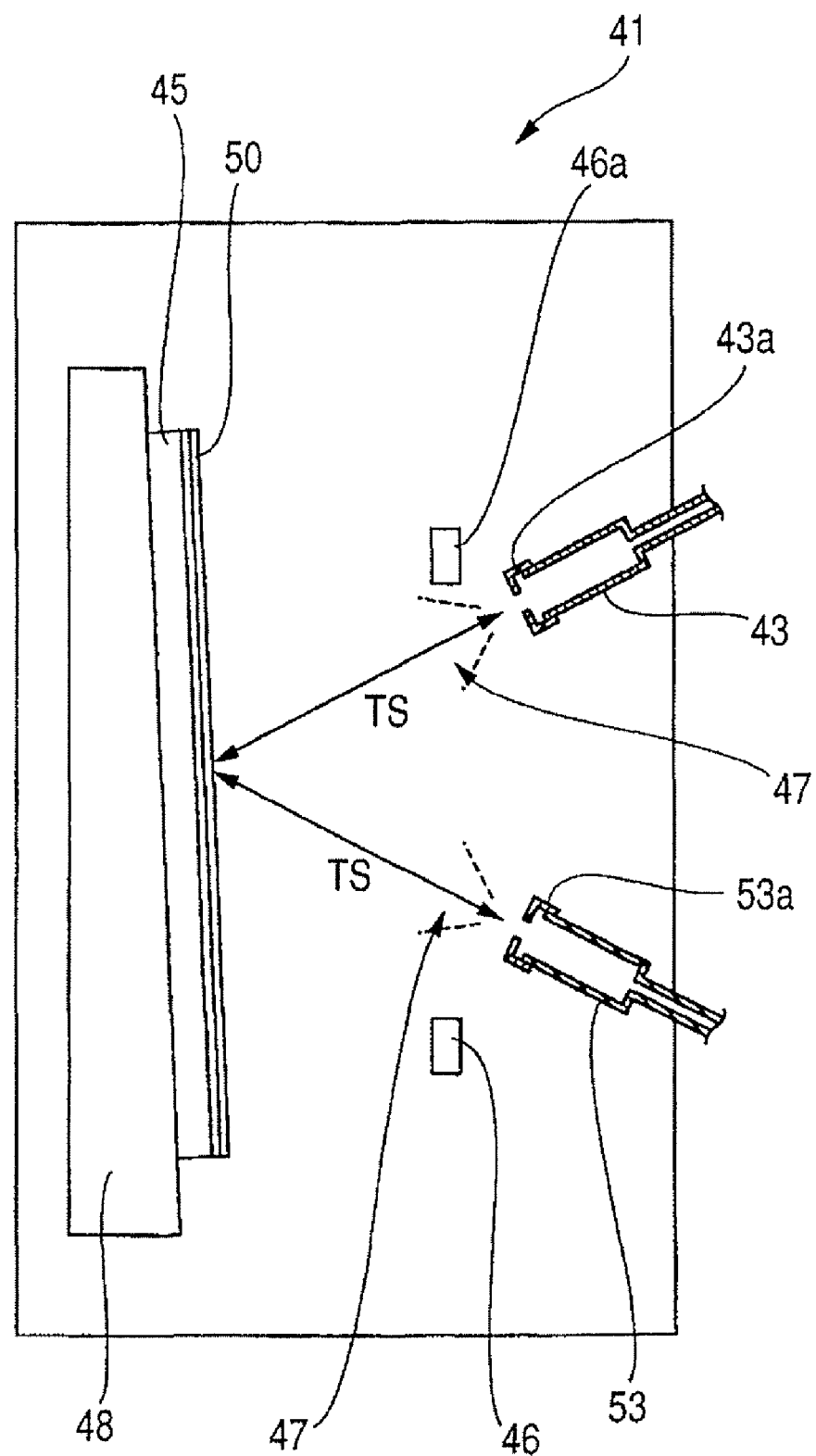
FIG. 4 is a schematic view illustrating a producing apparatus used for performing a film formation method according to still further another embodiment of the present invention.

As shown in FIG. 4, for forming a film in the state that a substrate 45 is stood vertically to the ground in a vacuum chamber 41, a substrate holding mechanism 42 for holding the substrate 45 is arranged along a side wall of the vacuum chamber. A mask 50 is disposed on the side of a surface of the substrate 45. Herein, the substrate 45 is held slightly inclined from the vertical surface to the ground by the substrate holding mechanism 42 and a supporting table 48 for making the holding state easily maintained. Two vapor deposition sources 43 and 53 are arranged at positions opposite to the substrate 45.

Orifices 43a and 53a of the respective vapor deposition sources 43 and 53 have a mechanism by which the orifices 43a and 53a alone move independently. The vapor deposition sources are ones called the valve cell, and have a mechanism by which the vapor deposition rate is controlled by adjusting the internal pressure of the vapor deposition sources.

Hereinafter, a case where an organic compound layer is formed as a film using the apparatus will be described.

In the prestage to start vapor deposition on the substrate 45, the vapor deposition rates are controlled so that the vapor deposition rates from the first and second vapor deposition sources 43 and 53 are stabilized in predetermined ranges, and then vapor depositions on the substrate 45 are started. In the vapor deposition period and certain periods before and after the vapor deposition period, the film thickness sensor 46 in the vicinity of the vapor deposition sources detects the vapor deposition rate at intervals of one second.

If there arises a case where a variation of a predetermined vapor deposition rate range or more is confirmed in the vapor deposition period by the film thickness sensor 46, the separated distance TS between the substrate and the opening of the vapor deposition source is adjusted referring to the time change rate of the vapor deposition rate such that the film thickness distribution after the completion of the vapor deposition can fall on the target value at the time of the confirmation. Specifically, the separated distance TS is adjusted by controlling the orifice of the valve cell. Since the vapor deposition apparatus shown in FIG. 4 forms a film having a predetermined film thickness on the substrate surface based on the addition of evaporation materials from the plurality of vapor deposition sources, adjustment is needed to make the vapor deposition rate from each vapor deposition source fall within a predetermined range by interlocking the orifice control of the vapor deposition sources. Hence, the film thickness distribution can be corrected in the course of film formation in a time zone when a variation has occurred.

The target value of the distance to be adjusted is appropriately selected from the relation between the time change rate of the previously obtained vapor deposition rate and the time change rate of the film thickness distribution.

According to the embodiment, change with elapse of time in film thickness distribution can be controlled within a predetermined range even for film formation over a long period.

Therefore, in the thus produced organic electroluminescent devices, light emission unevenness can be suppressed on pixels and substrate surfaces, and the luminance deterioration with elapse of time is reduced.

Embodiment 3

In Embodiment 3, the separated distance TS is controlled corresponding to change wit elapse of time in pressure inside a vacuum chamber. Hereinafter, a case where one of organic compound layers constituting an organic electroluminescent device is formed as a film will be described.

A producing apparatus of an organic electroluminescent device shown in FIG. 2 is provided in the upper section thereof with a substrate 15 and a substrate holding mechanism 12 for holding the substrate 15. The substrate holding mechanism 12 is provided with a substrate position control mechanism 14 which can move the substrate 15 along the normal direction to the surface of the substrate 15. A vapor deposition source 13 is arranged in the lower section of the apparatus. A film thickness sensor 16 and a pressure sensor (not shown) are provided in a space between the vapor deposition source 13 and the substrate 15.

Hereinafter, a case where an organic compound layer is formed as a film using the apparatus will be described.

In the prestage to start vapor deposition on the substrate 15, the vapor deposition rate is controlled so that the vapor deposition rate from the vapor deposition source 13 is stabilized within a predetermined range, and then vapor deposition on the substrate 15 is started. In the vapor deposition period and certain periods before and after the vapor deposition period, the film thickness sensor 16 and the pressure sensor detect their changes with elapse of time at intervals of one second.

If there arises a case where a variation of a predetermined vapor deposition rate range or more is confirmed in the vapor deposition period by the film thickness sensor 16, or where a variation of a predetermined pressure range or more is confirmed by the pressure sensor, the separated distance TS between the substrate 15 and the opening 13a provided at the vapor deposition source 13 is adjusted referring to the time change rates of the vapor deposition rate and the pressure such that the film thickness distribution after the completion of the vapor deposition can fall on the target value at the time of the confirmation. The target value of the separated distance TS to be adjusted is appropriately selected from the previously obtained relation between the vapor deposition rate and the pressure and the film thickness distribution. Hence, the film thickness distribution can be corrected in the course of film formation in a time zone when a variation has occurred.

For example, when the pressure decreases with elapse of time, since the difference between the pressure detected in the vacuum chamber 11 and the pressure in the vicinity of the opening of the vapor deposition source increases, the distance L shortens. Hence, the substrate 15 is moved to the direction of the vapor deposition source 13 so that the separated distance TS is shortened. By contrast, when the pressure increases with elapse of time, the separated distance TS is controlled so as to be elongated. Optionally, the changed amount of the separated distance TS may be determined also by combining the time change of the vapor deposition rate being simultaneously sensed. The embodiment will be further specifically described by way of an example of a case where the separated distance TS is set to 200 mm; the film thickness on completion of vapor deposition is set to 100 nm; and the target value of the film thickness distribution is set to be ±10% in a vapor deposition region of 200 mmφ. Further, the vapor deposition rate is set to 1 nm/sec, and its allowable range is set to ±5%.

For example, in a process where film formation is performed continuously on a plurality of substrates, the pressure inside the vacuum chamber at the time of the start of film formation on a first substrate is set to 5e-4 Pa, and the pressure in the vicinity of the crucible opening is set to 1e-2 Pa, and when the pressure inside the vacuum chamber decreases to 3e-4 Pa in the course of the process, the separated distance TS is changed to 195 mm. By thus shortening the separated distance TS by 5 mm, a shortening amount of the distance L is corrected, and the substantial separated distance TS' can be stabilized in the process period, thereby providing a predetermined film thickness distribution for all the substrates.

At this time, although the substrate 15 is moved to adjust the separated distance TS between the substrate 15 and the opening 13a provided at the vapor deposition source 13, the film thickness sensor 16 and the pressure sensor are not moved to that direction.

The present embodiment controls change with elapse of time in film thickness distribution within a predetermined range even in a film formation over a long period. Therefore, any organic electroluminescent devices produced by such a method can suppress light emission unevenness on pixels and substrate surfaces, and reduce the luminance deterioration with elapse of time.

Embodiment 4

In Embodiment 4, the separated distance TS is controlled based on changes with elapse of time in the temperature inside a vacuum chamber. Hereinafter, a case where one of organic compound layers constituting an organic electroluminescent device is formed as a film will be described.

In the producing apparatus of an organic electroluminescent device shown in FIG. 2, a substrate 15 and a substrate holding mechanism 12 for holding the substrate 15 are provided in the upper section thereof. The substrate holding mechanism 12 is provided with a substrate position control mechanism 14 which can move the substrate 15 along the normal direction to the substrate surface. A vapor deposition source 13 is arranged in the lower section thereof. A film thickness sensor 16 and a temperature sensor (not shown) are provided in a space between the vapor deposition source 13 and the substrate 15.

Hereinafter, a case where an organic compound layer is formed as a film using the apparatus will be described.

In the prestage to start vapor deposition on the substrate 15, the vapor deposition rate is controlled so that the vapor deposition rate from the vapor deposition source 13 is stabilized within a predetermined range, and then vapor deposition on the substrate 15 is started. In the vapor deposition period and certain periods before and after the vapor deposition period, the film thickness sensor 16 and the temperature sensor detect their changes with elapse of time at intervals of one second.

If there arises a case where a variation of a predetermined vapor deposition rate range or more is confirmed in the vapor deposition period by the film thickness sensor 16, or where a variation of a predetermined temperature range or more is confirmed by the temperature sensor, the separated distance TS between the substrate 15 and the opening 13a provided at the vapor deposition source 13 is adjusted referring to the time change rates of the vapor deposition rate and the temperature such that the film thickness distribution after the completion of the vapor deposition can fall on the target value at the time of the confirmation. The target value of the separated distance TS to be adjusted is appropriately selected from the previously obtained relation between the vapor deposition rate and the pressure and the film thickness distribution.

Hence, the film thickness distribution can be corrected in the course of film formation in a time zone when a variation has occurred.

For example, when the temperature decreases with elapse of time, since the difference between the temperature in the vicinity of the opening 13a provided at the vapor deposition source 13 and that inside the vacuum chamber 11 increases with elapse of time, the distance L is elongated. Hence, the separated distance TS is controlled so as to be elongated by moving the substrate 15 to the direction of the vapor deposition source 13. By contrast, when the temperature increases with elapse of time, the separated distance TS is controlled so as to be shortened. Optionally, the changed amount of the separated distance TS may be determined also by combining the time change of the vapor deposition rate being simultaneously sensed.

The embodiment will be further specifically described by way of an example of a case where the separated distance TS is set to 200 mm; the film thickness on completion of vapor deposition is set to 100 nm; and the target value of the film thickness distribution is set to be ±10% in a vapor deposition region of 200 mmφ. Further, the vapor deposition rate is set to 1 nm/sec, and its allowable range is set to ±5%.

For example, in a process where film formation is performed continuously on a plurality of substrates, the temperature inside the vacuum chamber at the time of the start of film formation on a first substrate is set to 30° C., and the temperature in the vicinity of the crucible opening is set to 150° C., and when the temperature inside the vacuum chamber decreases to 20° C. in the course of the process, the separated distance TS is set to 205 mm. By thus elongating the separated distance TS by 5 mm, an elongating amount of the distance L is corrected, and the substantial separated distance TS' can be stabilized in the film formation period, thereby providing a predetermined film thickness distribution for all the substrates.

At this time, although the substrate 15 is moved to adjust the separated distance TS between the substrate 15 and the opening 13a provided at the vapor deposition source 13, the film thickness sensor 16 and the temperature sensor are not moved to that direction.

The present embodiment allows to control change with elapse of time in film thickness distribution within a predetermined range even in a film formation over a long period. Therefore, any organic electroluminescent devices produced by such a method can suppress light emission unevenness in pixels and substrate surfaces, and reduce the luminance deterioration with elapse of time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-098370, filed on Mar. 31, 2006, and 2007-074086, filed on Mar. 22, 2007, which are hereby incorporated by reference herein in their entirety.

What is claimed is:

1. A film formation method for forming a film on a substrate by discharging a vapor deposition material mounted on a vapor deposition source from the vapor deposition source arranged opposite to the substrate in a vacuum chamber, the film formation method comprising:

discharging the vapor deposition material from the vapor deposition source by heating the vapor deposition material;

detecting a pressure inside the vacuum chamber during the discharging of the vapor deposition material;

calculating a distance to be changed between an opening provided at the vapor deposition source and the substrate, based on a detection result of the pressure; and changing the distance between the opening provided at the vapor deposition source and the substrate by moving the vapor deposition source along the direction normal to a surface of the substrate or moving the substrate along the direction normal to a surface of the substrate, based on the calculation result, wherein when the pressure inside the vacuum chamber decreases with elapse of time, the distance is shortened, and when the pressure inside the vacuum chamber increases with elapse of time, the distance is elongated.

\* \* \* \* \*